(12) United States Patent
Okuda et al.

(10) Patent No.: US 6,323,794 B1
(45) Date of Patent: Nov. 27, 2001

(54) ΔΣ MODULATOR, DA CONVERTER AND AD CONVERTER

(75) Inventors: Takashi Okuda; Toshio Kumamoto; Yasuo Morimoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/437,405

(22) Filed: Nov. 10, 1999

(30) Foreign Application Priority Data

May 28, 1999 (JP) .............................. P11-149425

(51) Int. Cl.[7] .................................................. H03M 3/00
(52) U.S. Cl. ............................. 341/143; 341/144
(58) Field of Search .................... 341/143, 155, 341/144

(56) References Cited

U.S. PATENT DOCUMENTS

| | | | | |
|---|---|---|---|---|
| 5,274,375 | * | 12/1993 | Thompson | 341/143 |
| 5,446,460 | * | 8/1995 | Cabler | 341/143 |
| 5,500,645 | * | 3/1996 | Ribner et al. | 341/143 |
| 5,870,048 | * | 2/1999 | Kuo et al. | 341/143 |

FOREIGN PATENT DOCUMENTS 4-129316    4/1992  (JP) .
4-229722    8/1992  (JP) .

OTHER PUBLICATIONS

K. Uchimura et al., "Oversampling A–to–D and D–to–A Converters with Multistage Noise Shaping Modulators", reprinted from IEEE Trans. Acoust., Speech, Signal Processing, vol. AASP–36, pp. 1899–1905, Dec. 1988.

L. Richard Carley, "A Noise–Shaping Coder Topology for 15 + Bit Converters", reprinted from IEEE J. Solid State Circuits, vol. SC–24, pp. 267–273, Apr. 1989.

* cited by examiner

Primary Examiner—Peguy JeanPierre
(74) Attorney, Agent, or Firm—Burns, Doane, Swecker & Mathis, LLP

(57) ABSTRACT

Modulators ($M1$ to $Mk$ ($k \geq 2$)) are connected in a multi-stage such that each of quantization errors ($e1, e2, \ldots$) of the modulators ($M1$ to $Mk-1$) is fed to the input of the next stage modulator. Each output signal of the modulators ($M2$ to $Mk$) is fed back to the input of the immediately preceding modulator. The modulators ($M1$ to $Mk$) are all first-order modulators. Only the final stage modulator ($Mk$) has a multi-bit quantizer (6), and all the preceding modulators ($M1$ to $Mk-1$) have an 1-bit quantizer (3). Accordingly, a noise-shaping equal to that of a multi-bit higher-order modulator is realized on a small-scale circuit while retaining stability.

9 Claims, 13 Drawing Sheets

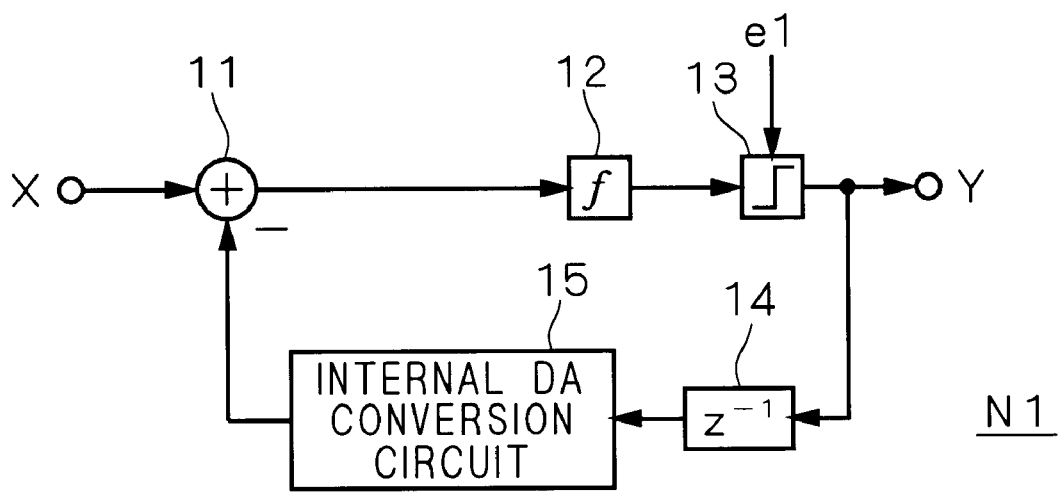
F I G. 4

103

107

108

ΔΣ MODULATOR, DA CONVERTER AND AD CONVERTER

BACKGROUND OF THE INVENTION

1. Field of the Invention

The present invention relates to a ΔΣ (delta-sigma) modulator, DA converter and AD converter, and, more particularly, relates to an improvement with which a noise-shaping equal to that of a multi-bit higher-order modulator required for improved accuracy is realized on a small-scale circuit while retaining stability.

2. Description of the Background Art

Presently, converters equipped with ΔΣ modulator are widely used as a high-precision DA converter or AD converter having a resolution over 14 bits. In a DA or AD converter having a ΔΣ modulator, a quantization with a small number of bit, such as 1-bit quantization, is performed while a folding noise and quantization noise are reduced by oversampling (for example, when handling voice signals, sampling is performed by an-integral multiple of the inherent sampling frequency, e.g., 44.1 kHz) and noise-shaping (i.e., the frequency characteristic of a quantization noise inherently flat is more enhanced at a higher frequency band).

FIGS. 13 and 14 are block diagrams showing the configurations of conventional DA converter and AD converter, each having a ΔΣ modulator, respectively. In the DA converter 151 shown in FIG. 13, an inputted digital signal ID is converted while it passes through an interpolation filter 70, ΔΣ modulator 71, internal DA conversion circuit and low-pass filter 73 in this order, and then outputted as an analog signal OA. The ΔΣ modulator 71 has in a feedback loop thereof (i.e., a signal transmission path in which a signal circulates through the input, the output, and the input) an integrator 76, quantizer 77 and delay circuit 78. For enabling feedback, an arithmetic operation unit 75 that serves as a substracter is provided at the intersection between the input line and feedback loop. The delay circuit 78 may be placed in anywhere within the feedback loop.

In the AD converter 152 shown in FIG. 14, an inputted analog signal IA is converted while it passes through an anti-aliasing filter 80, ΔΣ modulator 81 and decimation filter 82 in this order, and then outputted as a digital signal OD. The ΔΣ modulator 81 has in a feedback loop thereof an integrator 86, quantizer 87, delay circuit 88 and internal DA conversion circuit 89. For enabling feedback, an arithmetic operation unit 85 is provided at the intersection between the input line and feedback loop. The delay circuit 88 may be placed in anywhere within the feedback loop.

Since in the feedback loop of the ΔΣ modulator 71, digital signals are regarded as a processing object, all the circuits within the loop are configured as a digital circuit. Whereas in the feedback loop of the ΔΣ modulator 81, except for a signal transmission path from the output of the quantizer 87 to the input of the internal DA conversion circuit 89, analog signals are regarded as a processing object. Therefore, all the circuits within the feedback loop, except for the signal transmission path from the output of the quantizer 87 to the input of the internal DA conversion circuit 89, are configured as an analog circuit.

In the DA converter 151 and AD converter 152, their signal conversion accuracy as a whole, depends upon the accuracy of signal conversion in the ΔΣ modulators 71 and 81, respectively. To increase the conversion accuracy of the ΔΣ modulators 71 and 81, there have been known conventionally a method of increasing the order (order increasing method) and a method of increasing the number of output bit of a quantizer (multi-bit method). FIG. 15 is a block diagram showing an example where the order increasing method is applied. FIG. 16 is a block diagram showing an example where the multi-bit method is applied in addition to the order increasing method.

A quantizer 77 of a ΔΣ modulator 71a in FIG. 15 is an 1-bit quantizer, and a quantizer 79 of a ΔΣ modulator 71b in FIG. 16 is a multi-bit quantizer. In both ΔΣ modulators 71a and 71b, their feedback loops are branched into four, and one to four integrators 76 are interposed in each branch. That is, the ΔΣ modulator 71a is configured as an 1-bit fourth-order modulator, and the ΔΣ modulator 71b is configured as a multi-bit fourth-order modulator. The relationship between input signal X and output signal Y in the ΔΣ modulators 71a and 71b is expressed by using z conversion which is effective in describing a sample data control system, as follows:

Signals A to C, and Y in FIGS. 15 and 16 are expressed by the following formulas 1 to 4, respectively:

$$A=(X-z^{-1}Y)/(1-z^{-1}) \tag{1}$$

$$B=(A-z^{-1}Y)/(1-z^{-1}) \tag{2}$$

$$C=(B-z^{-1}Y)/(1-z^{-1}) \tag{3}$$

and $$Y=(C-z^{-1}Y)/(1-z^{-1})+e \tag{4}$$

wherein e is a quantizing error in the quantizer 77 or 79. From these formulas, there is obtained:

$$Y=X+(1-z^{-1})^4 e \tag{5}$$

Formula 5 shows that in the ΔΣ modulators 71a and 71b, a quantization noise e contributes to an output signal Y in the form proportional to the fourth-order differential coefficient of fourth order of the quantization noise e. Since the frequency characteristic of the quantization noise e is flat, the frequency characteristic of the fourth-order differential coefficient of the quantization noise e is expressed by the fourth-order function of frequency. Specifically, Formula 5 shows that, according to the fourth-order function, the influence of the quantization noise e on the output signal Y increases as frequency increases.

Thus in a higher-order modulator, the quantization noise e is minimized in a low frequency band whereas it is enhanced in a high frequency band, based on the function of higher order of frequency. Namely, noise-shaping is enhanced based on the function of fourth order of frequency. From the interpolation filter 70, the input signal X obtained by oversampling is inputted to the ΔΣ modulator 71, thereby the quantization noise e in the inherently required low frequency band (e.g., a band of not more than 44.1 kHz is required in voice signal processing) can be reduced effectively.

In addition, the quantization noise e itself is reduced by multi-bit method. Specifically, the quantization noise e reduces as the number of output bit of a quantizer is higher. In the ΔΣ modulator 71b, the number of bit of the quantizer 79 is larger than that of the quantizer 77 in the ΔΣ modulator 71a. Thereby, the quantization noise component in Formula 5 is lowered by that amount in the ΔΣ modulator 71b.

The foregoing is true for the ΔΣ modulator 81 as well. FIG. 17 is a block diagram illustrating an example where the order increasing method and multi-bit method are applied to the ΔΣ modulator 81, to obtain a ΔΣ modulator 81a. A quantizer 90 of the ΔΣ modulator 81a in FIG. 17 is a multi-bit quantizer. The feedback loop of the ΔΣ modulator 81a is branched into two, and one to two integrators 86 are interposed in each branch. That is, the ΔΣ modulator 81a is configured as a multi-bit second-order modulator. The relationship between input signal X and output signal Y in the ΔΣ modulator 81a is expressed as follows:

Signals D and Y in FIG. 17 are expressed as follows:

$$D=1/(1-z^{-1}) \cdot (X-z^{-1}Y-e_D) \quad (6);$$

and $$Y=1/(1-z^{-1}) \cdot (D-z^{-1}Y-e_D)+e \quad (7),$$

respectively, wherein e is a quantization error in the quantizer 90, and $e_D$ is a conversion error in the internal DA conversion circuit 89.

From Formulas 6 and 7, the signal Y is expressed as follows:

$$Y=X-e_D-(1-z^{-1})e_D+(1-z^{-1})^2 e \quad (8)$$

Formula 8 shows that in the ΔΣ modulator 81a, a quantization noise e contributes to an output signal Y in the form proportional to the second-order differential coefficient of the quantization noise e. Accordingly, in the ΔΣ modulator 81a, noise-shaping is enhanced based on the second-order function of frequency. As described, in the ΔΣ modulators 71 and 81, conversion accuracy can be increased by the order increasing method and multi-bit method.

Unfortunately, it is known that the order increasing method presents the problem of reduction in the stability of a ΔΣ modulator. In general, it is difficult, they say, to obtain stability in a modulator of three-order or more. Although it is known that the multi-bit method can improve stability, it is necessary to prepare a DA conversion circuit corresponding to a multi-bit, as the internal DA conversion circuits 72 and 89 of the converters 151 and 152, respectively. It is also known that it is not easy to form uniform elements (not shown) which are provided such as to correspond to a multi-bit in the internal DA conversion circuits 72 and 89, respectively, and that a mismatch (non-uniformity) between the elements deteriorates conversion accuracy. To avoid deterioration of conversion, a randomizer that selects at random the elements constituting the internal DA conversion circuits 72 and 89, is required to be disposed at the preceding stage of the elements. This causes the problem that circuit scale is increased.

SUMMARY OF THE INVENTION

According to a first aspect of the invention, a ΔΣ modulator comprises: (A) 1-bit first to (k−1)th (k≧2) modulators of second-order or less, each m-th (1≦m≦k−1) modulator comprising, along a first feedback loop, (A-1) an integrator, (A-2) a quantizer for performing quantization by 1-bit, connected to an output of the integrator, and (A-3) a first arithmetic operation unit disposed between an output of the quantizer and an input of the integrator, in which an input signal to the m-th modulator and a reverse signal of a signal from the quantizer are added and, in case that a feedback signal to the m-th modulator is present, the feedback signal is further added to transmit a result to the integrator, the each m-th modulator further comprising (A-4) a delay circuit having a predetermined order which delays signal transmission and is disposed within the mentioned first feedback loop, and (A-5) a second arithmetic operation unit which outputs a reverse signal of an error signal of the quantizer, as an input signal of a next stage modulator; (B) a multi-bit k-th modulator of second-order or less, comprising, along a second feedback loop, (B-1) an integrator, (B-2) a quantizer for performing quantization by a multi-bit, connected to an output of the integrator (B-1), and (B-3) a first arithmetic operation unit disposed between an output of the quantizer and an input of the integrator, in which an input signal to the k-th modulator and a reverse signal of a signal from the quantizer (B-2) are added to transmit the result to the integrator (B-1), the k-th modulator further comprising (B-4) a delay circuit having a predetermined order which delays signal transmission and is disposed within the mentioned second feedback loop; and (C) first to (k−1)th feedback arithmetic operation units, each i-th (1≦i≦k−1) feedback arithmetic operation unit being connected to an output of the quantizer of the (i+1)th modulator, comprising (C-1) a leading circuit having an order which cancels sum of orders of delay circuits along a path from the first arithmetic operation unit of the t-th (1≦t≦i) modulator to the i-th feedback arithmetic operation unit, and (C-2) a differentiator circuit having an order which cancels sum of orders of integrators along a path from the first arithmetic operation unit of the (t+1)th modulator to the i-th feedback arithmetic operation unit, thereby a result of arithmetic operation is transmitted, as the feedback signal, to the first arithmetic operation unit of the t-th modulator.

According to a second aspect, the ΔΣ modulator of the first aspect is characterized in that the each i-th feedback arithmetic operation unit transmits the result of arithmetic operation, as the feedback signal, to the first arithmetic operation unit of the i-th modulator.

According to a third aspect, the ΔΣ modulator of the first aspect is characterized in that the each n-th (1≦n≦k) modulator further comprises a DA conversion circuit disposed between the quantizer of the n-th modulator and the first arithmetic operation unit of the n-th modulator, for converting a signal from digital form into analog form; and the each i-th feedback arithmetic operation unit is connected to the output of the quantizer of the (i+1)th modulator, through the DA conversion circuit of the (i+1)th modulator.

According to a fourth aspect, a DA converter comprises: an interpolation filter for receiving a digital signal; a ΔΣ modulator according to any one of the first to third, sixth, and seventh aspects which receives an output signal of the interpolation filter; a conversion circuit which converts an output signal of the ΔΣ modulator into an analog signal; and a lowpass filter for receiving an output signal of the conversion circuit.

According to a fifth aspect, a DA converter comprises: a ΔΣ modulator of the fourth or fifth aspect which receives an analog signal; and a decimation filter for receiving an output signal of the ΔΣ modulator.

In the first aspect, all the first to k-th modulators connected in a multi-stage are of second-order or less, only the final stage is a multi(i.e., plural)-bit modulator, and all the preceding stages are a 1-bit modulator. Therefore, no randomizer is required, and a noise-shaping characteristic equal to that of a multi-bit higher-order modulator can be obtained without impairment of stability, while reducing circuit scale.

In the second aspect, since the output signals of the second to k-th modulators are fed back to the input of the immediately preceding modulators, via the first to (k−1)th feedback arithmetic operation units, respectively, the order of the differentiator in each of the first to (k−1)th feedback arithmetic operation units is minimized. This leads to a further reduction in circuit scale.

In the third aspect, since the DA conversion circuit is provided, a ΔΣ modulator for processing analog signal is realized. In addition, a conversion error of the final stage DA conversion circuit, which converts the output signal of a multi-bit quantizer to an analog signal, is also subjected to noise-shaping. This permits an output signal that is less affected by a conversion error of the DA conversion circuit to be obtained.

In the fourth aspect, thanks to the ΔΣ modulator of any one of the first to third, sixth, and seventh aspects, it is possible to obtain, without impairing stability, a noise reduction effect equal to that in a DA converter having a multi-bit higher-order modulator, as well as a reduction in circuit scale.

In the fifth aspect, thanks to the ΔΣ modulator of the fourth or fifth aspect, it is possible to obtain, without impairing stability, a noise reduction effect equal to that in a DA converter having a multi-bit higher-order modulator, as well as a reduction in circuit scale.

It is an object of the present invention to provide a ΔΣ modulator, DA converter and AD converter which overcome the problems in the conventional devices and realize a noise-shaping equal to that of a multi-bit higher-order modulator, without impairing stability or increasing circuit scale.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a block diagram of the interior of a modulator in FIG. 3;

DESCRIPTION OF THE PREFERRED EMBODIMENTS

Outline of Preferred Embodiments

Figure 1:
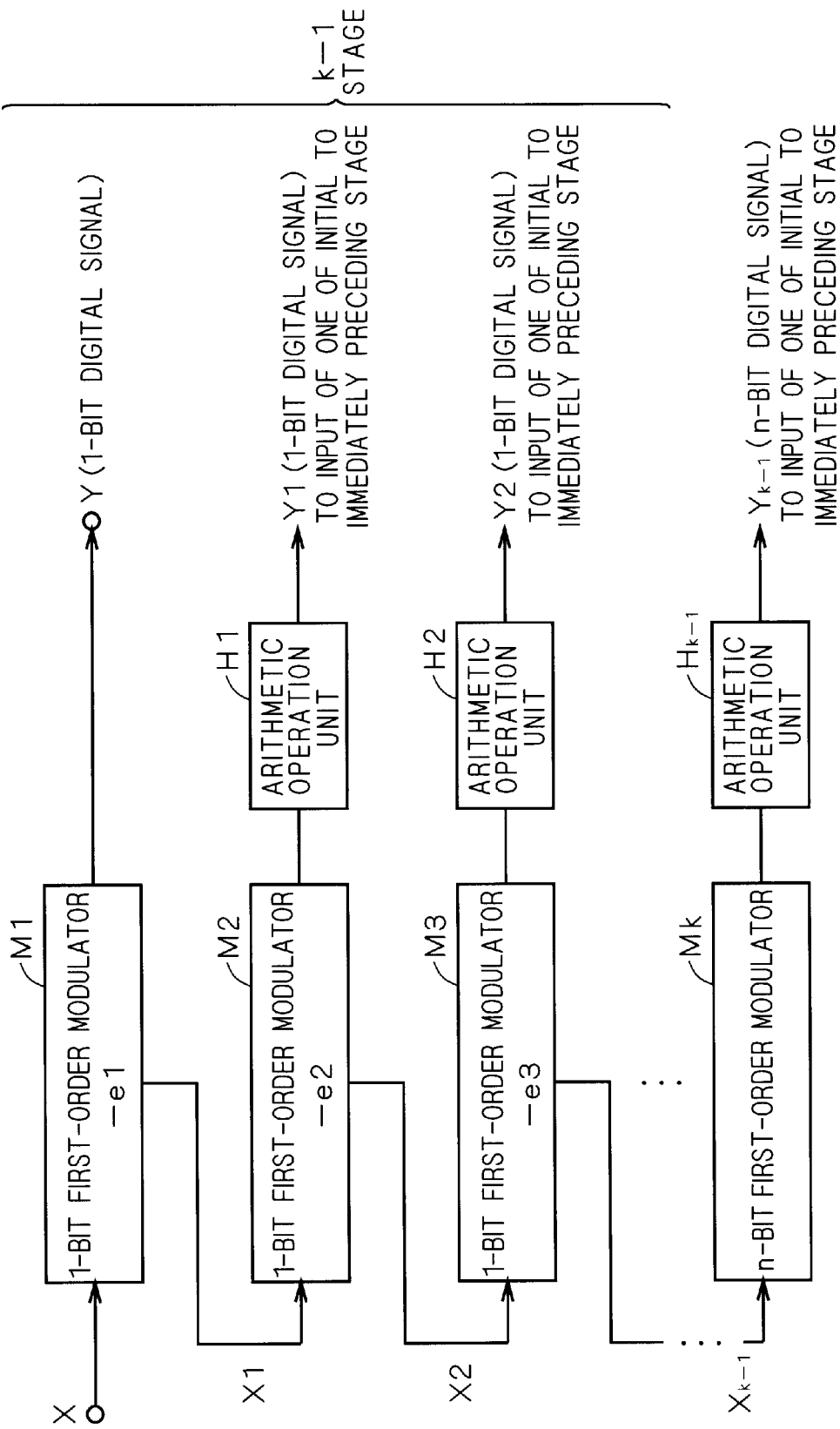
FIG. 1 is a block diagram schematically showing a device in accordance with one preferred embodiment of the invention.

Outline of preferred embodiments of the present invention will be described firstly. FIG. 1 is a block diagram of a ΔΣ modulator in accordance with one preferred embodiment which is suitable for being incorporated into a DA converter. To this ΔΣ modulator 101, a digital signal representing a sampling value that is discrete at predetermined time intervals is inputted as an input signal X. The ΔΣ modulator 101 has modulators M1 to Mk ($k \geq 2$) and arithmetic operation units H1 to Hk−1. The modulators M1 to Mk are connected in a multi-stage in this order.

Figure 2:
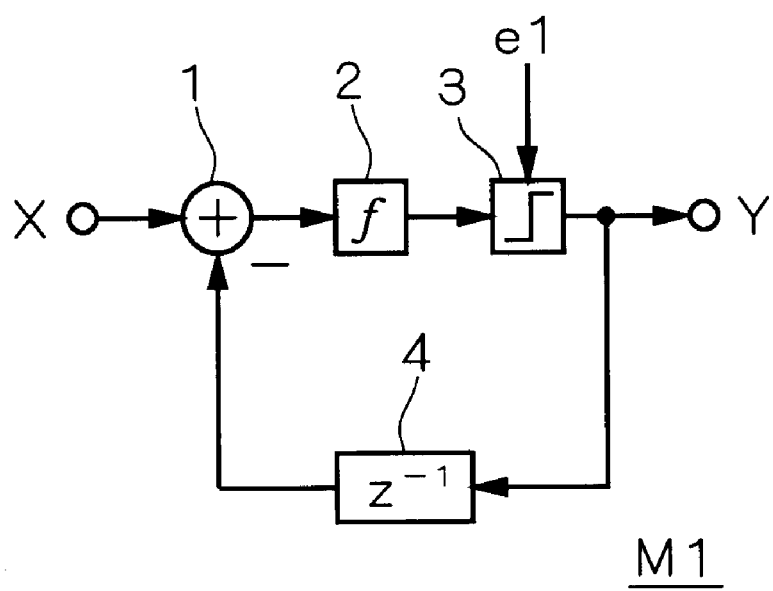
FIG. 2 is a block diagram of the interior of a modulator in FIG. 1.

The modulators M1 to Mk−1 have the same configuration. FIG. 2 is a block diagram of the internal configuration of the modulator M1, as the representative of the modulators M1 to Mk−1. The modulator M1 has in a feedback loop thereof an integrator 2, 1-bit quantizer 3, and first-order delay circuit 4, which are mutually connected in cascade. For enabling feedback, an arithmetic operation unit 1 is provided at the intersection between the input line and feedback loop. These circuit elements are configured as a digital circuit for processing digital signals. The delay circuit 4 may be placed in anywhere within the feedback loop.

That is, the modulators M1 to Mk−1 are 1-bit first-order modulators, whereas the final stage modulator Mk is a multi-bit first-order modulator. The modulator Mk is configured by changing, in FIG. 2, the 1-bit quantizer 3 to a multi-bit quantizer. Note that the order of the modulators M1 to Mk may be generally second-order or less. Such a general embodiment will be described later as a modification.

A multi-stage connection of the modulators M1 to Mk is performed such that a reverse signal −ei of a quantization error ei of a modulator Mi (i is 1 to k−1) is fed to the input of the next stage modulator Mi+1. The output signal of a modulator Mj (j is 2 to k) is fed back to one of the inputs of the modulators M1 to Mj−1, through an arithmetic operation unit Hj−1.

An arithmetic operation unit Hi is a differentiator of which order is equal to the difference in stage number between the feedback origin and feedback destination. By using z conversion, the arithmetic operation unit Hi is expressed as follows:

$$Hi = (1-z^{-1})^n \qquad (9)$$

wherein n is a difference in stage number.

When a feedback through the arithmetic operation unit H1 is made for the immediately preceding modulator, $n=1$. When it is made for the initial modulator M1, $n=i$.

Since the ΔΣ modulator 101 has the multi-stage modulators M1 to Mk connected in the mentioned fashion, it realizes a noise-shaping characteristic equal to that of a multi-bit higher-order modulator. In addition, no randomizer is required because in the modulators M1 to Mk connected in a multi-stage, only the final stage one is a multi-bit modulator and all preceding stages are configured as an 1-bit modulator. Furthermore, stability is not impaired because in the initial to final stage modulators M1 to Mk, their respective orders are second-order at the most, and, at least the final stage one is configured as a multi-bit modulator.

Consequently, with the ΔΣ modulator 101, a noise-shaping equal to that of a multi-bit higher-order modulator is achieved on a small-scale circuit while maintaining stability. With respect to the noise-shaping characteristic of the ΔΣ modulator 101, a specific configuration will be described in detail in the following preferred embodiments 1 and 2, by employing formulas.

Figure 3:
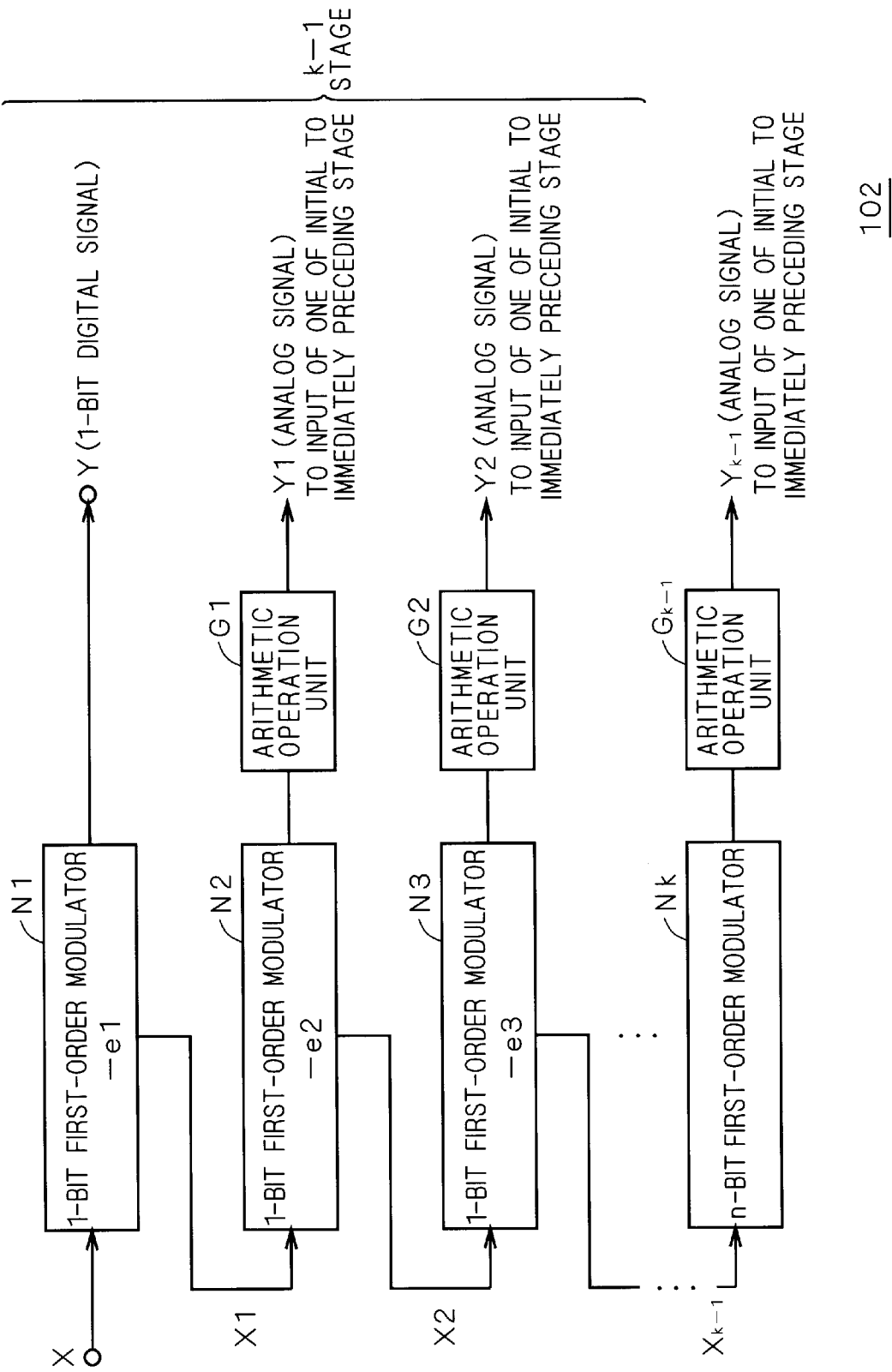
FIG. 3 is a block diagram schematically showing another device in accordance with one preferred embodiment of the invention.

FIG. 3 is a block diagram schematically showing the configuration of a ΔΣ modulator in accordance with one preferred embodiment which is suitable for being incorporated into an AD converter. To this ΔΣ modulator 102, an analog signal is inputted as an input signal X. An outstanding distinction of the ΔΣ modulator 102 over the ΔΣ modulator 101 is that the modulators M1 to Mk are changed to modulators N1 to Nk and the arithmetic operation units H1 to Hk−1 are changed to arithmetic operation units G1 to Gk−1, respectively.

The modulators N1 to Nk−1 have the same configuration. FIG. 4 is a block diagram of the internal configuration of the modulator N1, as the representative of the modulators N1 to Nk−1. The modulator N1 has in a feedback loop thereof an integrator 12, 1-bit quantizer 13, first-order delay circuit 14 and internal DA conversion circuit, which are mutually connected in cascade. For enabling feedback, an arithmetic operation unit 11 is provided at the intersection between the input line and feedback loop. The delay circuit 14 may be placed in anywhere within the feedback loop.

In the feedback loop, a digital signal representing a sampling value that is discrete at predetermined time intervals is transmitted only through a path from the output of the quantizer 13 to the internal DA conversion circuit 15, and an analog signal is transmitted in other paths. Therefore, only the delay circuit 14 is configured as a digital circuit for processing digital signals, and other circuit elements are configured as an analog circuit for processing analog signals.

The final stage modulator Nk is configured by changing, in FIG. 4, the 1-bit quantizer 13 to a multi(i.e., two or more)-bit quantizer, and the internal DA conversion circuit 15 corresponding to 1-bit to an internal DA conversion circuit corresponding to a multi-bit. Specifically, the modulators N1 to Nk are the same as the modulators M1 to Mk in that the modulators N1 to Nk−1 are 1-bit first-order modulators and the final stage modulator Nk is a multi-bit first-order modulator. Note that the order of the modulators N1 to Nk may be generally second-order or less. Such a general embodiment will be described later as a modification.

A multi-stage connection of the modulators N1 to Nk is performed such that a reverse signal −ei of a quantization error ei of a modulator Ni is fed to the input of the next modulator Ni+1. The output signal of a modulator Nj is fed back to one of the inputs of the modulators N1 to Nj−1, through an arithmetic operation unit Gj−1.

An arithmetic operation unit Gi has a differentiator of which order is equal to the difference in stage number between the feedback origin and feedback destination, and an (i−1)th order leading circuit (not shown) connected in cascade to the differentiator. Therefore, the arithmetic operation unit Gi is expressed as follows:

$$Gi=(1-z^{-1})^n/z^{-1(n+1)} \quad (10)$$

wherein n is a difference in stage number.

Thus, with the ΔΣ modulator 102, a noise-shaping equal to that of a multi-bit higher-order modulator is achieved on a small-scale circuit while maintaining stability, as in the case with ΔΣ modulator 101. As to the noise-shaping characteristic of the ΔΣ modulator 102, a specific configuration will be described in detail in the following preferred embodiments 3 and 4, by employing formulas.

First Preferred Embodiment

Figure 5:
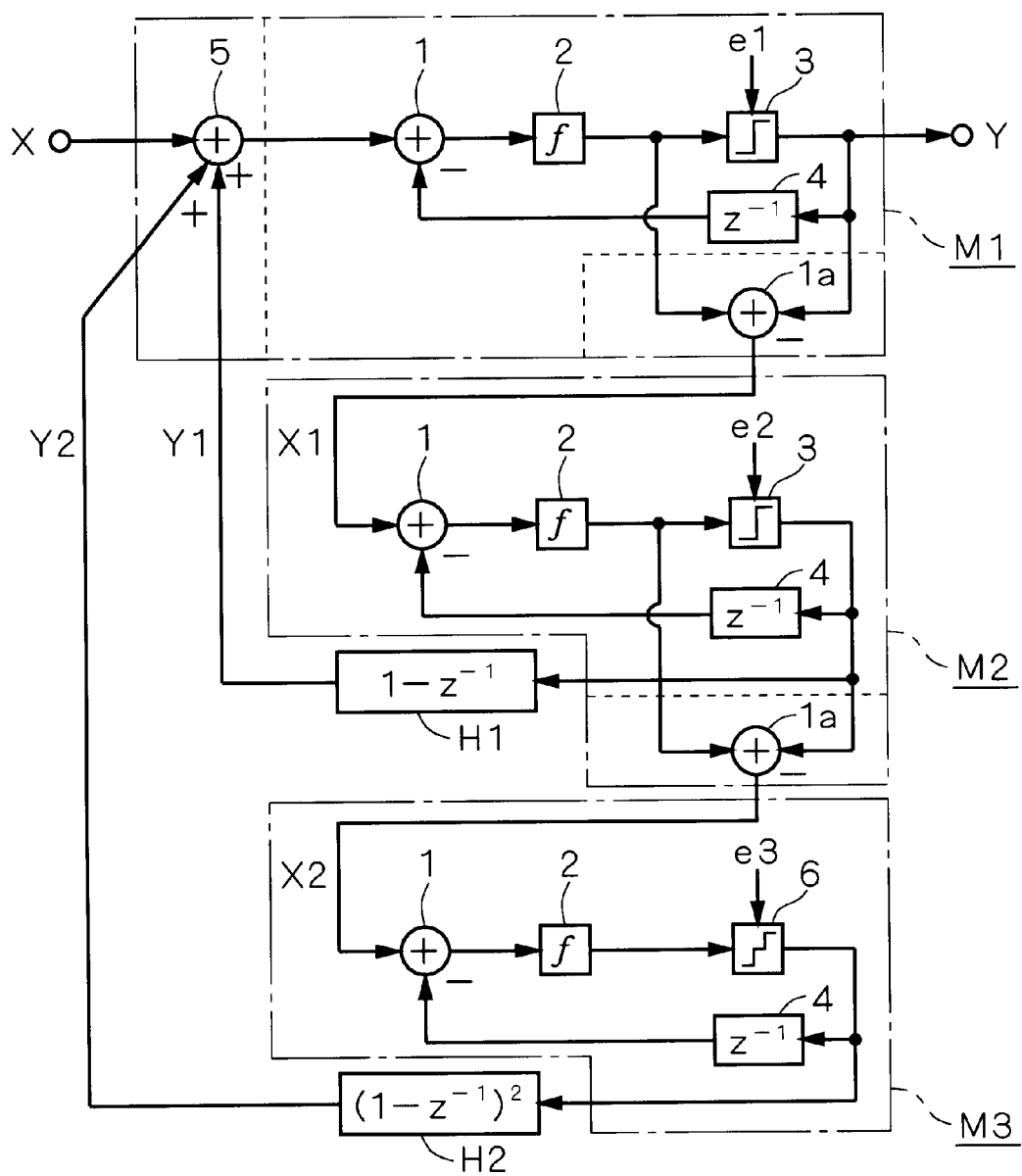
FIG. 5 is a block diagram of a device in accordance with a first preferred embodiment of the invention.

FIG. 5 is a block diagram showing the configuration of a ΔΣ modulator in accordance with a first preferred embodiment. This ΔΣ modulator 103 corresponds to one device in which, in the ΔΣ modulator 101 of FIG. 1, the number of stages k is three, modulators M1 to M3 are all configured as the first-order modulator, and all the output signals of the second to final stage modulators M2 to M3 are fed back to the input of the initial stage modulator M1.

Each of the modulators M1 to Mk−1 has a block shown in FIG. 2, and the final stage modulator Mk has a block which is formed by changing, in FIG. 2, the 1-bit quantizer 3 to a multi-bit quantizer 6. In FIG. 5, arithmetic operation units 1 output the difference between an input signal and feedback signal (in other words, the sum of the input signal and a reverse signal of the feedback signal), and an arithmetic operation unit 5 outputs the sum of the input signal and feedback signals.

A multi-stage connection of the modulators M1 to Mk is performed such that a reverse signal −ei of a quantization error ei of a modulator Mi is fed to the input of the next modulator Mi+1, through an arithmetic operation unit 1a as an input signal X1 or X2. The output signal of a modulator Mj is fed back to the input of the initial modulator M1, through an arithmetic operation unit Hj−1 as an output signal Y1 or Y2, and the signal fed back is then added to an input signal X by the arithmetic operation unit 5. Therefore, from Formula 9, the arithmetic operation unit Hi is expressed as follows:

$$Hi=(1-z^{-1})^i \quad (11)$$

The relationship between the input signal X and the output signal Y in the ΔΣ modulator 103 so configured is expressed by using z conversion, as follows. Firstly, between the input signals X, X1 and X2 and the output signals Y, Y1 and Y2 in respective stages, the following relationships are established:

$$Y2=H2[X2+(1-z^{-1})e3];$$

$$Y1=H1[X1+(1-z^{-1})e2];$$

and $$Y=(X+Y1+Y2)+(1-z^{-1})e1$$

From these relationships, there is obtained:

$$Y=X+(1-z^{-1})e1+(1-z^{-1})H1\cdot e2+(1-z^{-1})\ H2\cdot e3+H1\cdot X1+H2\cdot X2 \quad (12)$$

The input signals X1 and X2 are given by X1=−e1 and X2=−e2, respectively.
Thus, from Formulas 11 and 12, there is obtained:

$$Y=X+(1-z^{-1})^3 e3 \quad (13)$$

As best shown by comparison with Formula 5, Formula 13 expresses the third-order noise-shaping characteristic, and a quantization error e3 caused in Formula 13 is a quantization error of a multi-bit quantizer 6. Therefore, the ΔΣ modulator 103 shows a noise-shaping characteristic equal to that of a multi-bit third-order modulator.

When the number of stages of the ΔΣ modulator 103 is expanded from three-stage to a general k-stage, Formula 13 is expandable as follows:

$$Y=X+(1-z^{-1})^k ek \quad (14)$$

Formula 14 can be easily obtained by performing the same arithmetic procedure as in obtaining Formula 13. Formula 14 shows the k-th-order noise-shaping characteristic. Therefore, in general, when the number of stages is k, the ΔΣ modulator 103 shows a noise-shaping characteristic equal to that of a multi-bit k-th-order modulator.

Referring to FIG. 5, the arithmetic operation units 1 and 5 of the modulator M1 can be viewed as the elements of a single arithmetic operation unit performing addition and subtraction. Also, as shown by dotted line, the arithmetic operation units 5 and 1a contained in the modulators M1 and M2 can be viewed as an external element of the modulators M1 and M2. The same is true for the following preferred embodiments.

Second Preferred Embodiment

Figure 6:
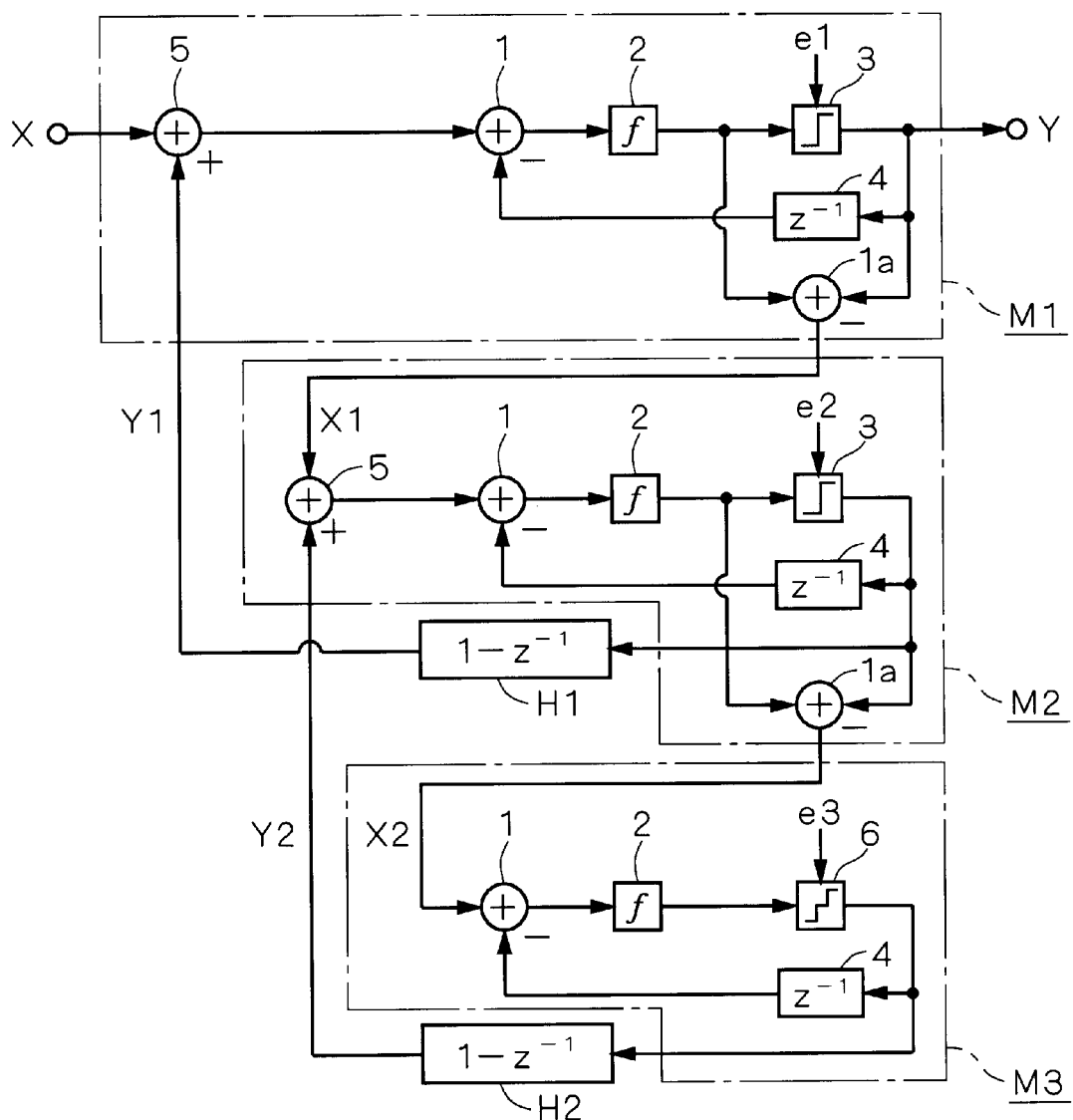
FIG. 6 is a block diagram of a device in accordance with a second preferred embodiment.

FIG. 6 is a block diagram showing the configuration of a ΔΣ modulator in accordance with a second preferred embodiment. This ΔΣ modulator 104 corresponds to one device in which, in the ΔΣ modulator 101 of FIG. 1, the number of stages k is three, the modulators M1 to M3 are all configured as the first-order modulator, and the output signals of the second to final stage modulators M2 to M3 are respectively fed back to the input of the immediately preceding modulators.

Each of the modulators M1 to Mk−1 has a block as shown in FIG. 2, and the final stage modulator Mk has a block which is formed by changing, in FIG. 2, the 1-bit quantizer 3 to a multi-bit quantizer 6. A multi-stage connection of the modulators M1 to Mk is performed such that a reverse signal −ei of a quantization error ei of a modulator Mi is fed to the input of the next stage modulator Mi+1, through an arithmetic operation unit 1 as an input signal X1 or X2. The output signal of a modulator Mj is fed back to the input of the immediately preceding modulator Mj−1, through an arithmetic operation unit Hj−1 as an output signal Y1 or Y2, and the signal fed back is then added to an input signal X or X1 by the arithmetic operation unit 5. Thus, the arithmetic operation unit Hi is expressed as follows:

$$Hi = 1 - z^{-1} \quad (15)$$

The relationship between the input signal X and the output signal Y in the ΔΣ modulator 104 so configured is expressed by using z conversion, as below. Firstly, between the input signals X, X1 and X2 and the output signals Y, Y1 and Y2 in respective stages, the following relationships are established:

$$Y2 = H2[X2 + (1-z^{-1})e3];$$

$$Y1 = H1[Y2 + X1 + (1-z^{-1})e2];$$

and $$Y = (X + Y1) + (1-z^{-1})e1$$

From these relationships, there is obtained:

$$Y1 = H2 \cdot H1 \cdot X2 + (1-z^{-1})H2 \cdot H1 \cdot e3 + H1 \cdot X1 + (1-z^{-1})H1 \cdot e1 \quad (16)$$

The input signals X1 and X2 are given by X1=−e1 and X2=−e2, respectively.

Thus, from Formula 16, there is obtained:

$$Y1 = -H2 \cdot H1 \cdot e2 + (1-z^{-1})H2 \cdot H1 \cdot e3 - H1 \cdot e1 + (1-z^{-1})H1 \cdot e2$$

Further, there is obtained:

$$Y1 = -H1 \cdot e1 + (1-z^{-1})H2 \cdot H1 \cdot e3$$

In a similar manner, there is obtained:

$$Y = -H1 \cdot e1 + (1-z^{-1})H2 \cdot H1 \cdot e3 + X + (1-z^{-1})e1$$

Thus, from Formula 15, there is obtained:

$$Y = X + (1-z^{-1})^3 e3 \quad (17)$$

As best shown by comparison with Formula 5, Formula 17 expresses the third-order noise-shaping characteristic, and a quantization error e3 caused in Formula 17 is a quantization error of a multi-bit quantizer 6. Therefore, the ΔΣ modulator 104 shows a noise-shaping characteristic equal to that of a multi-bit third-order modulator. In addition, it is sufficient if a first-order differentiator is provided in each of the arithmetic operation units H1 to Hk−1. This leads to a further reduction in circuit scale than the ΔΣ modulator 103.

When the number of stages of the ΔΣ modulator 104 is expanded from three-stage to a general k-stage, Formula 17 is expandable as follows:

$$Y = X + (1-z^{-1})^k ek \quad (18)$$

Formula 18 can be easily obtained by performing the same arithmetic procedure as in obtaining Formula 17. Formula 18 shows the k-th-order noize-shaping characteristic. Therefore, in general, when the number of stages is k, the ΔΣ modulator 104 shows a noise-shaping characteristic equal to that of a multi-bit k-th-order modulator.

Third Preferred Embodiment

Figure 7:
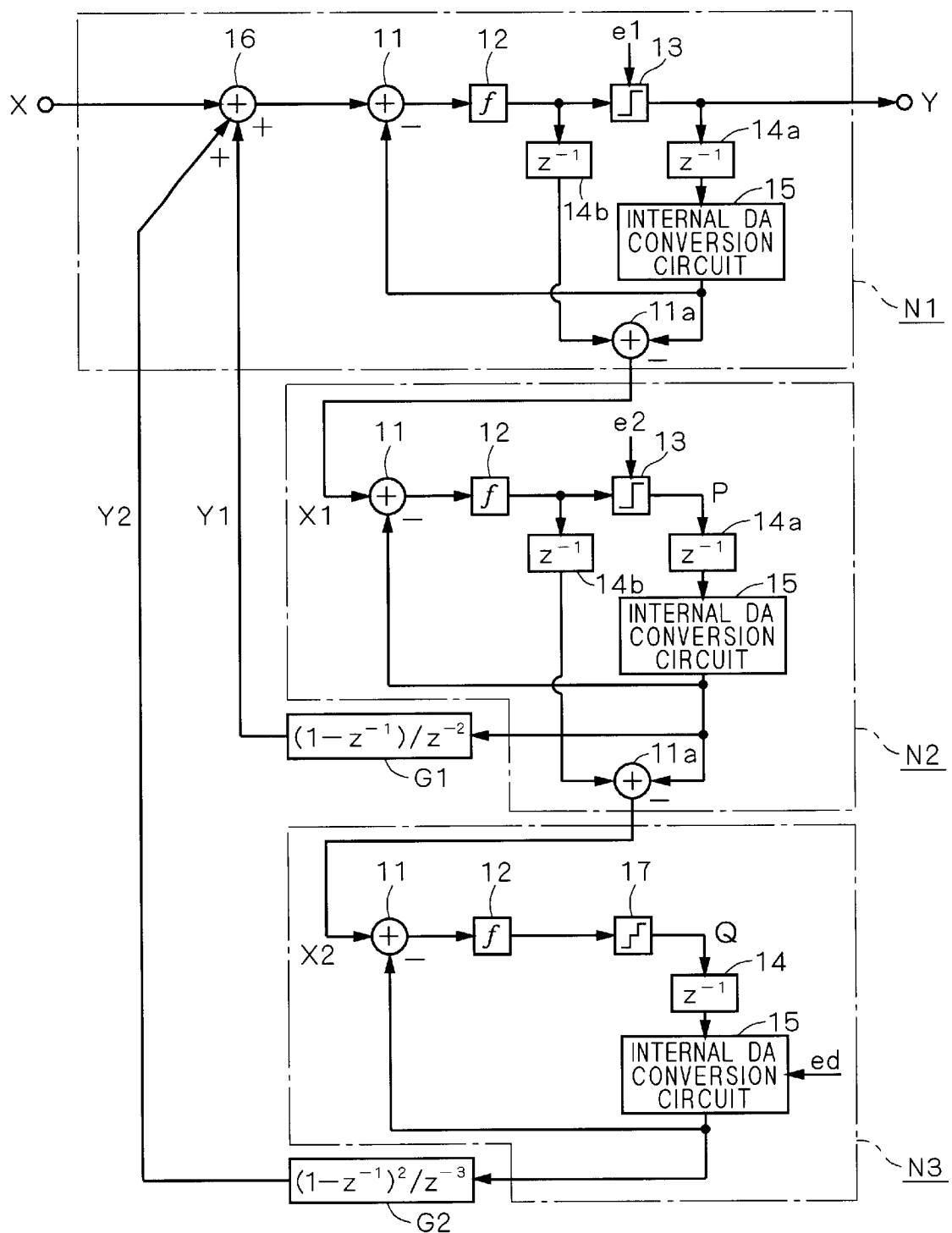
FIGS. 7 and 8 are block diagrams of a device in accordance with a third preferred embodiment.

FIG. 7 is a block diagram showing the configuration of a ΔΣ modulator in accordance with a third preferred embodiment. This ΔΣ modulator 105 corresponds to one device in which, in the ΔΣ modulator 102 shown in FIG. 3, the number of stages k is three; the modulators N1 to N3 are all configured as the first-order modulator; and all the output signals of the second to final stage modulators N2 to N3 are fed back to the input of the initial stage modulator N1.

Each of the modulators N1 to Nk−1 has a block shown in FIG. 4. The final stage modulator Nk has a block which is formed by changing, in FIG. 4, the 1-bit quantizer 13 to a multi-bit quantizer 17, and changing the internal DA conversion circuit 15 corresponding to 1-bit, to an internal DA conversion circuit 18 corresponding to a multi-bit. In FIG. 7, arithmetic operation units 11 output the difference between an input signal and feedback signal (in other words, the sum of the input signal and a reverse signal of the feedback signal), and an arithmetic operation unit 16 outputs the sum of the input signal and feedback signals.

A multi-stage connection of the modulators N1 to Nk is performed such that a reverse signal −ei of a quantization error ei of a modulator Ni is fed to the input of the next stage modulator Ni+1, through the arithmetic operation unit 11a as an input signal X1 or X2. The output signal of the quantizer 13 is of a digital form whereas its input signal is of an analog form. Therefore, in order to unify the signals in form, the output signal of the quantizer 13 is inputted to the arithmetic operation unit 11a via the internal DA conversion circuit 15. Since the output signal of the quantizer 13 is inputted to the arithmetic operation unit 11a further via a first-order delay circuit 14a, the input signal of the quantizer 13 is also inputted to the arithmetic operation unit 11a via a first-order delay circuit 14b. That is, a reverse signal −ei of a quantization error ei is inputted to the input of the next stage, via the delay circuits 14a, 14b, internal DA conversion circuit 15 and arithmetic operation unit 11a.

An error ed of an internal DA conversion circuit 18 corresponding to a multi-bit is derived from a mismatch between elements provided in the circuit 18. The internal DA conversion circuit 15 corresponding to 1-bit causes no errors derived from a mismatch between elements.

The output signal of a modulator Nj is fed back to the input of the initial stage modulator N1, through an arithmetic operation unit Gj−1as an output signal Y1 or Y2, and the signal fed back is then added to an input signal X by the arithmetic operation unit 16. Thus, the arithmetic operation unit Gi is expressed as follows:

$$Gi=(1-z^{-1})^i/z^{-(i+1)} \qquad (19)$$

The relationship between the input signal X and the output signal Y in the ΔΣ modulator 105 so configured is expressed by using z conversion as below. Firstly, the output signal Y, and signals P and Q in the modulators N2 and N3 are described as follows:

$$Y=X+z^{-1}\cdot G1\cdot P+G2(z^{-1}\cdot Q+ed)+(1-z^{-1})\cdot e1;$$

$$P=-z^{-1}\cdot e1+(1-z^{-1})e2;$$

and $$Q=-z^{-1}\cdot e2-ed+(1-z^{-1})e3$$

From these relationships, there is obtained:

$$\begin{aligned} Y &= X + z^{-1} \cdot G1[-z^{-1} \cdot e1 + (1 - z^{-1})e2] + \\ & \quad G2 \cdot z^{-1} \cdot [-z^{-1} \cdot e2 - ed + (1 - z^{-1})e3] + \\ & \quad G2 \cdot ed + (1 - z^{-1})e1 \\ &= X + [z^{-2} \cdot G1 - (1 - z^{-1})]e1 + \\ & \quad z^{-1}[(1 - z^{-1})G1 - z^{-1} \cdot G2]e2 + \\ & \quad (1 - z^{-1})G2 \cdot ed + z^{-1}(1 - z^{-1})G2 \cdot e3 \end{aligned} \qquad (20)$$

Thus, from Formulas 19 and 20, there is obtained:

$$Y=X+[(1-z^{-1})^3/z^{-2}]e3+[(1-z^{-1})^3/z^{-3}]ed \qquad (21)$$

As best shown by comparison with Formula 8, Formula 21 expresses the third-order noise-shaping characteristic, and a quantization error e3 caused in Formula 21 is a quantization error of a multi-bit quantizer 17. Therefore, the ΔΣ modulator 105 shows a noise-shaping characteristic equal to that of a multi-bit third-order modulator.

As to the conversion error ed of the internal DA conversion circuit 18, in Formula 8 there exists a component free from noise-shaping, whereas in Formula 21 such a component does not exist and all are subjected to the third-order noise-shaping.

When the number of stages of the ΔΣ modulator 105 is expanded from three-stage to a general k-stage, Formula 21 is expandable as follows:

$$Y=X+[(1-z^{-1})^k/Z^{-(k-1)}]e3+[(1-z^{-1})^k/z^{-k}]ed \qquad (22)$$

Formula 22 can be easily obtained by performing the same arithmetic procedure as in obtaining Formula 21. Formula 22 shows the k-th-order noise-shaping characteristic. Therefore, in general, when the number of stages is k, the ΔΣ modulator 105 shows a noise-shaping characteristic equal to that of a multi-bit k-th-order modulator. The conversion error ed of the internal DA conversion circuit 18 is also subjected to the k-th-order noise-shaping.

Figure 8:
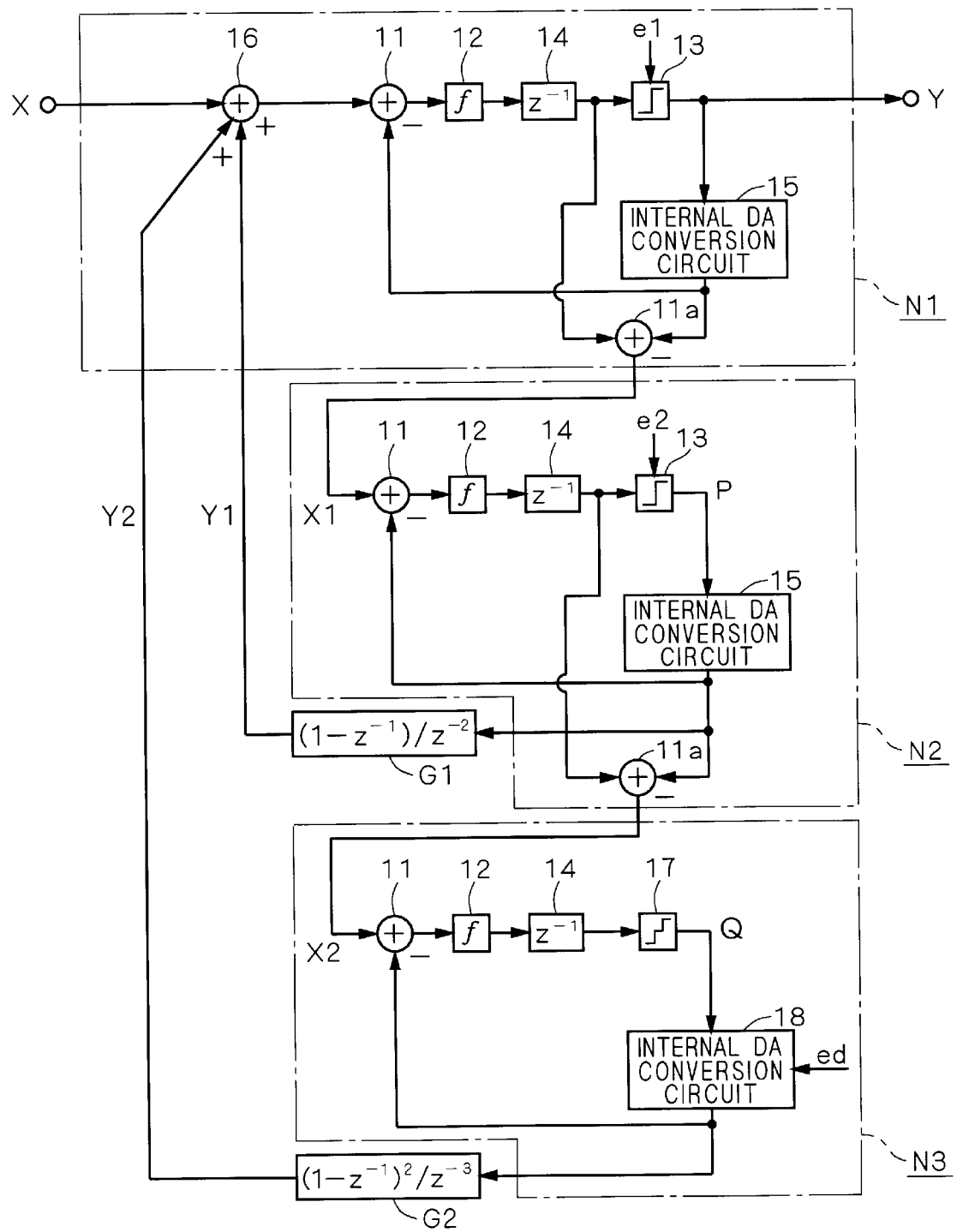

In the ΔΣ modulator 105, the two delay circuits 14a and 14b are provided in each of the modulators N1 to Nk−1. It is also possible to configure a ΔΣ modulator in which a single delay circuit is provided in each of the modulators N1 to Nk−1, as in the case with a ΔΣ modulator 105a shown in FIG. 8. In the ΔΣ modulator 105a, the delay circuit 14 is disposed between an integrator 12 and quantizer 13 in each of the modulators N1 to Nk−1, and the delay circuit 14 is disposed between the integrator 12 and quantizer 17 in the modulator Nk. Even with the ΔΣ modulator 105a, a characteristic equal to that of the ΔΣ modulator 105 is obtained as stated below.

The relationship between the input signal X and the output signal Y in the ΔΣ modulator 105a is described by using z conversion, as below. Firstly, the output signal Y, and signals P and Q in the modulators N2 and N3 are described as follows:

$$Y=z^{-1}\cdot X+z^{-1}\cdot G1\cdot P+z^{3\cdot 1\,\, 1}\cdot G2(Q+ed)+(1-z^{-1})\cdot e1;$$

$$P=-z^{-1}\cdot e1+(1-z^{-1})e2;$$

and $$Q=-z^{-1}\cdot e2-z^{-1}\cdot ed+(1-z^{-1})e3$$

From these relationships, there is obtained:

$$\begin{aligned} Y &= z^{-1} \cdot X + z^{-1} \cdot G1[-z^{-1} \cdot e1 + (1 - z^{-1})e2] + \\ & \quad z^{-1} \cdot G2[-z^{-1} \cdot e2 - z^{-1} \cdot ed + (1 - z^{-1})e3 + ed] + \\ & \quad (1 - z^{-1})e1 \\ &= z^{-1} \cdot X + [(1 - z^{-1}) - z^{-2} \cdot G1]e1 + \\ & \quad z^{-1}[(1 - z^{-1})G1 - z^{1} \cdot G2]e2 + \\ & \quad z^{-1}(1 - z^{-1})G2 \cdot ed + z^{-1}(1 - z^{-1})G2 \cdot e3 \end{aligned} \qquad (23)$$

From Formulas 19 and 23, there is obtained:

$$Y=z^{-1}\cdot X+[(1-z^{-1})^3/z^{-2}]e3+[(1-z^{-1})^3/z^{-2}]ed \qquad (24)$$

As best shown by comparison with Formula 8, Formula 24 expresses the third-order noise-shaping characteristic, and a quantization error e3 caused in Formula 24 is a quantization error of the multi-bit quantizer 17. Therefore, the ΔΣ modulator 105a shows a noise-shaping characteristic equal to that of a multi-bit third-order modulator. As to the conversion error ed of the internal DA conversion circuit 18, in Formula 24 there exists no component free from noise-shaping, and all are subjected to the third-order noise-shaping.

When the number of stages of the ΔΣ modulator 105a is expanded from three-stage to a general k-stage, Formula 24 is expandable as follows:

$$Y=z^{-1\cdot X+}[(1-z^{-1})^k/z^{-(k-1)}]e3+[(1-z^{-1})^k/z^{-(k-1)}]ed \qquad (25)$$

Formula 25 can be easily obtained by performing the same arithmetic procedure as in obtaining Formula 24. Formula 25 shows the k-th-order noise-shaping characteristic. Therefore, in general, when the number of stages is k, the ΔΣ modulator 105a shows a noise-shaping characteristic equal to that of a multi-bit k-th-order modulator. The conversion error ed of the internal DA conversion circuit 18 is also subjected to the k-th-order noise-shaping.

Fourth Preferred Embodiment

Figure 9:
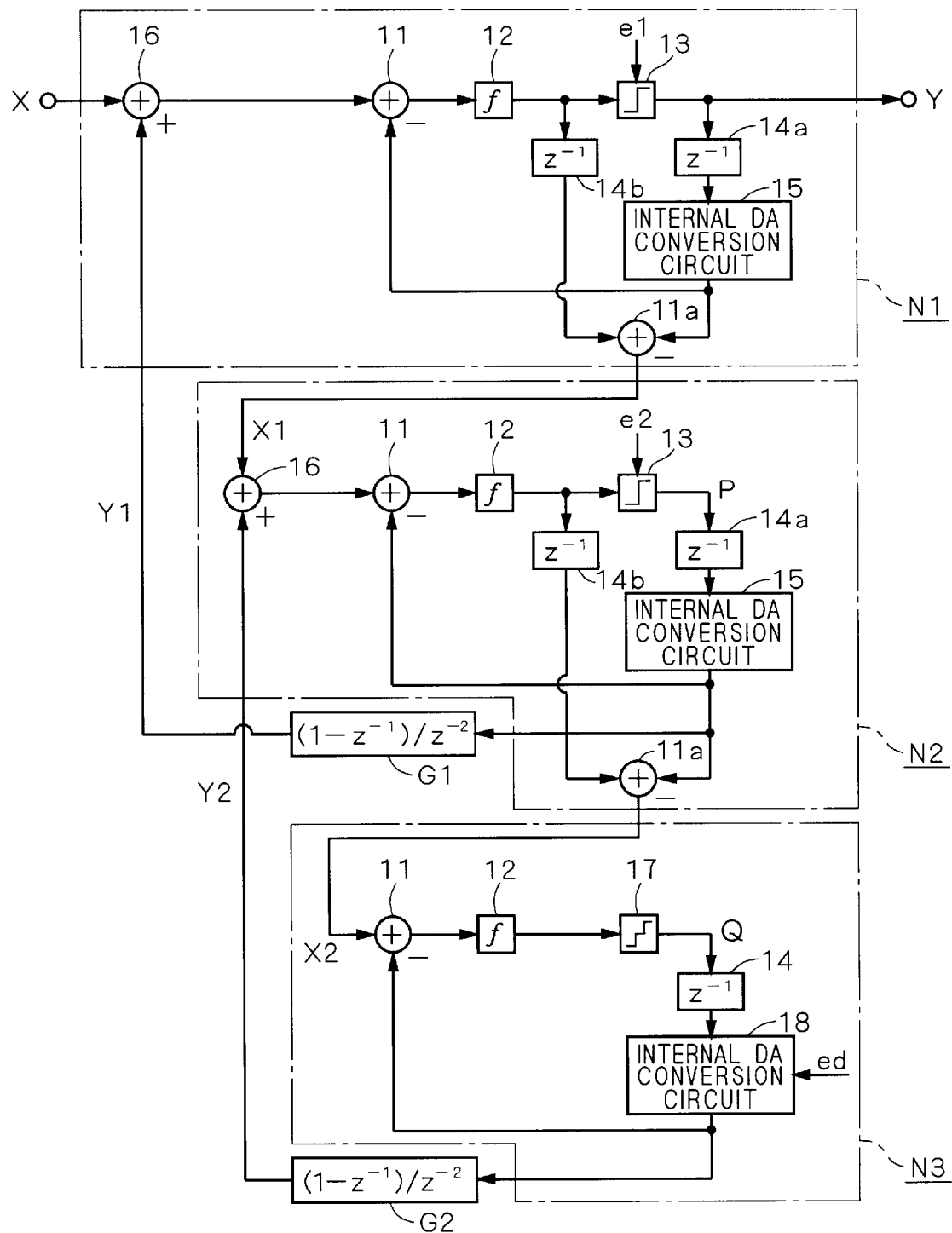
FIGS. 9 and 10 are block diagrams of a device in accordance with a fourth preferred embodiment.

FIG. 9 is a block diagram showing the configuration of a ΔΣ modulator in accordance with a fourth preferred embodiment. This ΔΣ modulator 106 corresponds to one device in which, in the ΔΣ modulator 102 shown in FIG. 3, the number of stages k is three, the modulators N1 to N3 are all configured as a first-order modulator, and the output signals of the second to final stage modulators N2 to N3 are fed back to the input of their respective immediately preceding stage modulators.

Each of the modulators N1 to Nk−1 has a block shown in FIG. 4. The final stage modulator Nk has a block which is formed by changing, in FIG. 4, the 1-bit quantizer 13 to a multi-bit quantizer 17, and changing the internal DA conversion circuit 15 corresponding to 1-bit, to an internal DA conversion circuit 18 corresponding to a multi-bit.

A multi-stage connection of the modulators N1 to Nk is performed such that a reverse signal −ei of a quantization error ei of a modulator Ni is fed to the input of the next stage modulator Ni+1, through an arithmetic operation unit 11a as an input signal X1 or X2. The output signal of the quantizer 13 is of a digital form whereas its input signal is of an analog form. Therefore, in order to unify the signals in form, the output signal of the quantizer 13 is inputted to the arithmetic operation unit 11a via the internal DA conversion circuit 15. Since the output signal of the quantizer 13 is inputted to the arithmetic operation unit 11a further via a delay circuit 14a, the input signal of the quantizer 13 is also inputted to the arithmetic operation unit 11a via a delay circuit 14b. That is, a reverse signal −ei of a quantization error ei is inputted to the input of the next stage modulator, via the delay circuits 14a, 14b, internal DA conversion circuit 15 and arithmetic operation unit 11a.

The output signal of a modulator Nj is fed back to the input of the immediately preceding modulator Nj−1, through an arithmetic operation unit Gj−1as an output signal Y1 or Y2, and the signal fed back is then added to an input signal X or X1 by the arithmetic operation unit 16. Thus, the arithmetic operation unit Gi is expressed as follows:

$$Gi=(1-z^{-1})/z^{-(i+1)} \quad (26)$$

The relationship between the input signal X and the output signal Y in the ΔΣ modulator 106 so configured is expressed by using z conversion, as follows. Firstly, the output signal Y, and signals P and Q in the modulators N2 and N3 are described as follows:

$$Y=X+G1 \cdot z^{-1} \cdot P+(1-z^{-1})e1;$$

$$P=-z^{-1} \cdot e1+G2(Q \cdot z^{-1}+ed)+(1-z^{-1})e2;$$

and $$Q=-z^{-1} \cdot e2-ed+(1-z^{-1})e3$$

From these relationships, there is obtained:

$$Y=X-z^{-1} \cdot G1 \cdot e1+\{(1-z^{-1})^2/z^{-1}\}G1 \cdot ed+(1-z^{-1})^2 \cdot G1e3+(1-z^{-1})e1 \quad (27)$$

Thus, from Formulas 26 and 27, there is obtained:

$$Y=X+[(1-z^{-1})^3/z^{-2}]e3+[(1-z^{-1})^3/z^{-3}]ed \quad (28)$$

As best shown by comparison with Formula 8, Formula 28 expresses the third-order noise-shaping characteristic, and a quantization error e3 caused in Formula 28 is a quantization error of a multi-bit quantizer 17. Therefore, the ΔΣ modulator 106 shows a noise-shaping characteristic equal to that of a multi-bit third-order modulator.

As to the conversion error ed of the internal DA conversion circuit 18, in Formula 28 there exists no component free from noise-shaping, and all are subjected to the third-order noise-shaping. In addition, it is sufficient if a first-order differentiator is provided in each of the arithmetic operation units G1 to Gk−1. This leads to a further reduction in circuit scale than the ΔΣ modulator 105.

When the number of stages of the ΔΣ modulator 106 is expanded from three-stage to a general k-stage, Formula 25 is expandable as follows:

$$Y=X+[(1-z^{-1})^k/z^{-(k-1)}]e3+[(1-z^{-1})^k/z^{-k}]ed \quad (29)$$

Formula 29 can be easily obtained by performing the same arithmetic procedure as in obtaining Formula 28. Formula 29 shows the k-th-order noise-shaping characteristic. Therefore, in general, when the number of stages is k, the ΔΣ modulator 106 shows a noise-shaping characteristic equal to that of a multi-bit k-th-order modulator. The conversion error ed of the internal DA conversion circuit 18 is also subjected to the k-tb-order noise-shaping.

Figure 10:
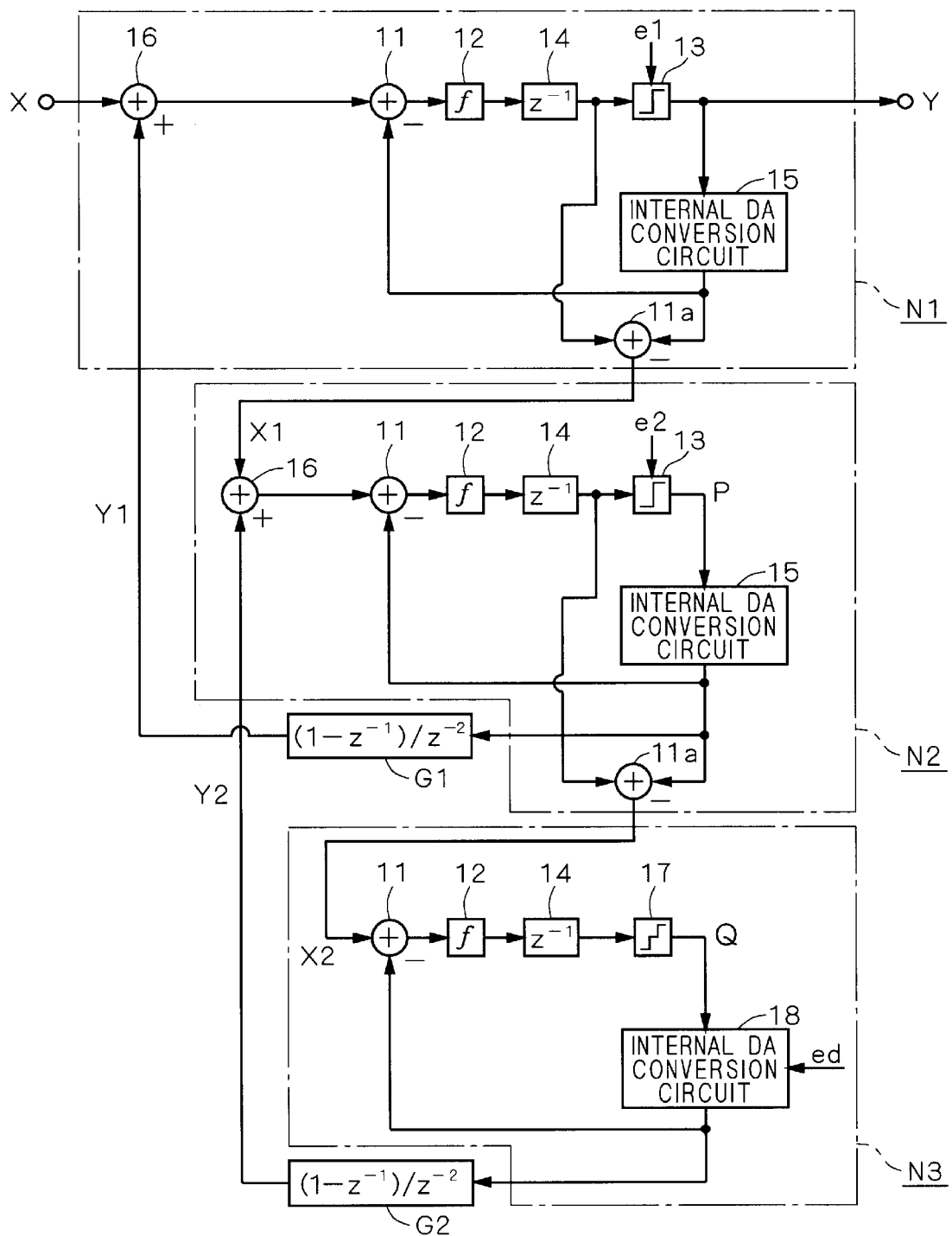

In the ΔΣ modulator 106, the two delay circuits 14a and 14b are provided in each of the modulators N1 to Nk−1. It is also possible to configure a ΔΣ modulator in which a single delay circuit 14 is provided in each of the modulators N1 to Nk−1, as in the case with the ΔΣ modulator 106a shown in FIG. 10. In the ΔΣ modulator 106a, the delay circuit 14 is disposed between an integrator 12 and quantizer 13 in each of the modulators N1 to Nk−1, and the delay circuit 14 is disposed between the integrator 12 and quantizer 17 in the modulator Nk. Even with the ΔΣ modulator 106a, a characteristic equal to that of the ΔΣ modulator 106 is obtained as stated below.

The relationship between the input signal X and the output signal Y in the ΔΣ modulator 106a is described by using z conversion, as below. Firstly, the output signal Y, and signals P and Q in the modulators N2 and N3 are described as follows:

$$Y=z^{-1} \cdot X+z^{-1} \; {}^{G}1 \cdot P+(1-z^{-1}) \cdot e1;$$

$$P=-z^{-1} \cdot e1+z^{-1} \cdot G2(Q \cdot z^{-1}+ed)+(1-z^{-1})e2;$$

and $$Q=-z^{-1} \cdot e2-z^{-1} \cdot ed+(1-z^{-1})e3$$

From these relationships, there is obtained:

$$Y=z^{-1} \cdot X-z^{-1} \cdot G1 \cdot e1+(1-z^{-1})^2 \cdot G1ed+(1-z^{-1})^2 \cdot G1 \cdot e3+(1-z^{-1})e1 \quad (30)$$

From Formulas 19 and 30, there is obtained:

$$Y=z^{-1} \cdot X+[(1-z^{-1})^3/z^{-2}]e3+[(1-z^{-1})^3/z^{-2}]ed \quad (31)$$

As best shown by comparison with Formula 8, Formula 31 expresses the third-order noise-shaping characteristic, and a quantization error e3 caused in Formula 31 is a quantization error of the multi-bit quantizer 17. Therefore, the ΔΣ modulator 106a shows a noise-shaping characteristic equal to that of a multi-bit third-order modulator. As to the conversion error ed of the internal DA conversion circuit 18, in Formula 31 there exists no component free from noise-shaping, and all are subjected to the third-order noise-shaping.

When the number of stages of the ΔΣ modulator 106a is expanded from three-stage to a general k-stage, Formula 31 is expandable as follows:

$$Y=z^{-1} \cdot X+[(1-z^{-1})^k/z^{-(k-1)}]e3+[(1-z^{-1})^k/z^{-(k-1)}]ed \quad (32)$$

Formula 32 can be easily obtained by performing the same arithmetic procedure as in obtaining Formula 31. Formula 32 shows the k-th-order noise-shaping characteristic. Therefore, in general, when the number of stages is k, the ΔΣ modulator 106a shows a noise-shaping characteristic equal to that of a multi-bit k-th-order modulator. The conversion error ed of the internal DA conversion circuit 18 is also subjected to the k-th-order noise-shaping.

Fifth Preferred Embodiment

Figure 11:
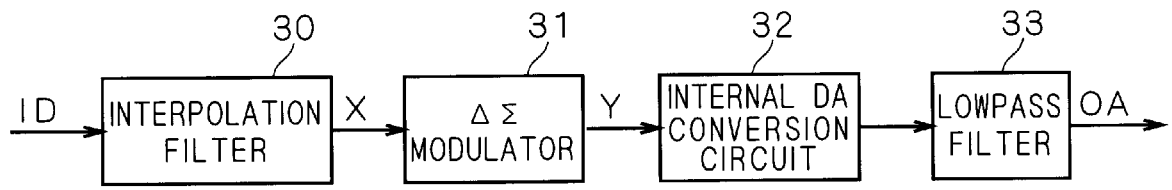
FIG. 11 is a block diagram of a device in accordance with a fifth preferred embodiment.

FIG. 11 is a block diagram of the configuration of a DA converter having a ΔΣ modulator in accordance with the first or second preferred embodiment. This DA converter 107 has an interpolation filter 30, ΔΣ modulator 31, internal DA conversion circuit 32 and lowpass filter 33.

The interpolation filter 30 receives, as a sampling data, a digital signal ID and interpolates it at higher sampling rate. That is, the interpolation filter 30 functions to raise the sampling rate. The ΔΣ modulator 31 is configured as a ΔΣ modulator 101, 103, 104, or 104a, and it performs noise-shaping against signal X outputted from the interpolation filter 30, and then outputs signal Y.

The internal DA conversion circuit 32 converts the signal Y from a digital form to analog form. The lowpass filter 33 suppresses a high frequency component of the analog signal outputted from the internal DA conversion circuit 32, and then selectively allows a low frequency component to pass through. Thereby, an analog signal OA that changes smoothly with time is outputted from the lowpass filter 33.

Sixth Preferred Embodiment

Figure 12:
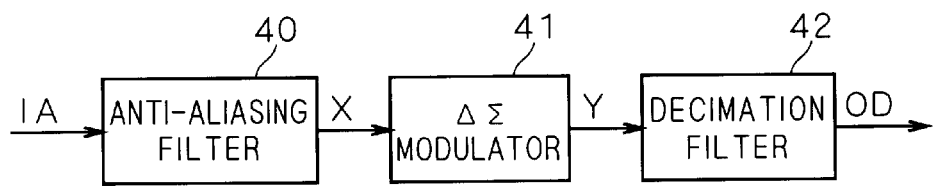
FIG. 12 is a block diagram of a device in accordance with a sixth preferred embodiment.
Figure 13:
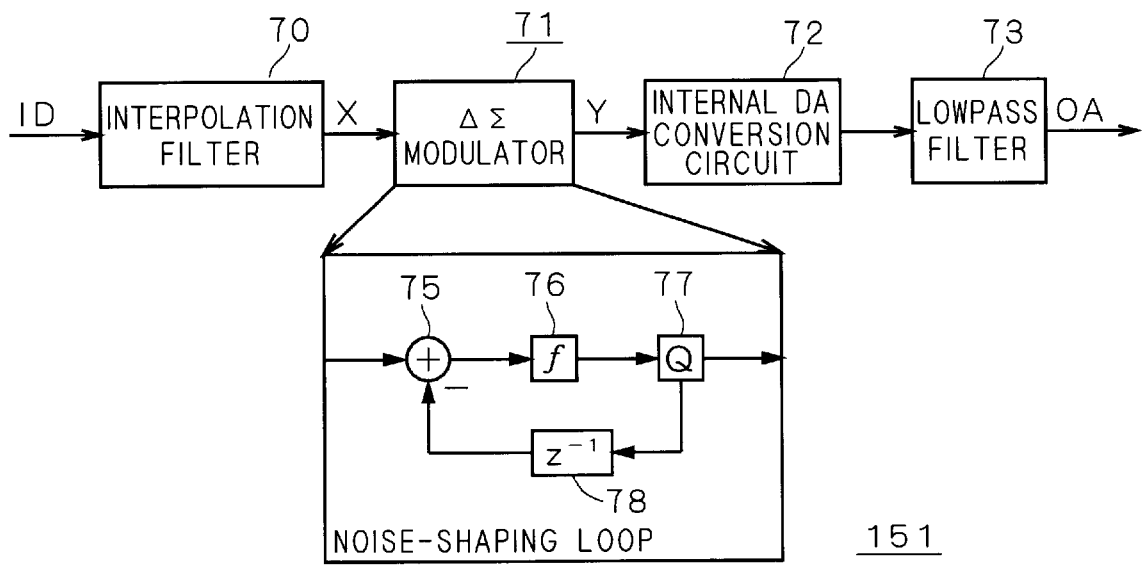
FIG. 13 is a block diagram of a conventional DA converter.
Figure 14:
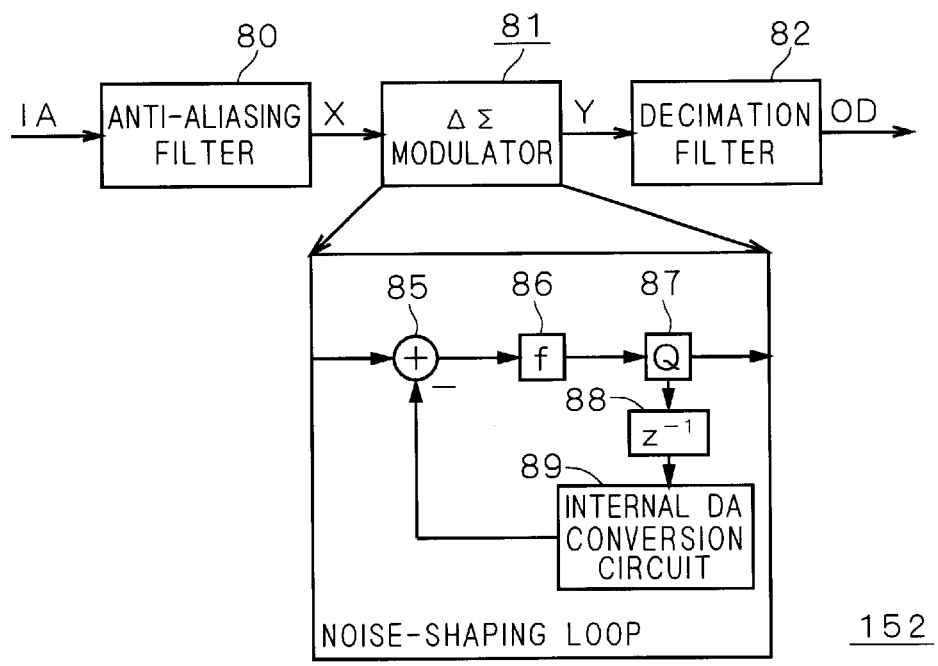
FIG. 14 is a block diagram of a conventional AD converter.

FIG. 12 is a block diagram of the configuration of an AD converter having a ΔΣ modulator in accordance with the third or fourth preferred embodiment. This AD converter 108 has an anti-aliasing filter 40, ΔΣ modulator 41 and decimation filter 42.

The anti-aliasing filter 40 is a kind of lowpass filter which receives an analog signal IA and suppresses its high frequency component in order to avoid aliasing. The ΔΣ modulator 41 is configured as a ΔΣ modulator 102, 105 or 106a, and it performs noise-shaping against signal X of analog form which is outputted from the anti-aliasing filter 40, and then outputs signal Y of a digital form.

The decimation filter 42 thins signal Y that is a sampling data, and then outputs it. That is, the decimation filter 42 functions to decrease the sampling rate. Thereby, from the decimation filter 42 a digital signal OD is outputted at a predetermined sampling rate.

Modifications

Figure 15:
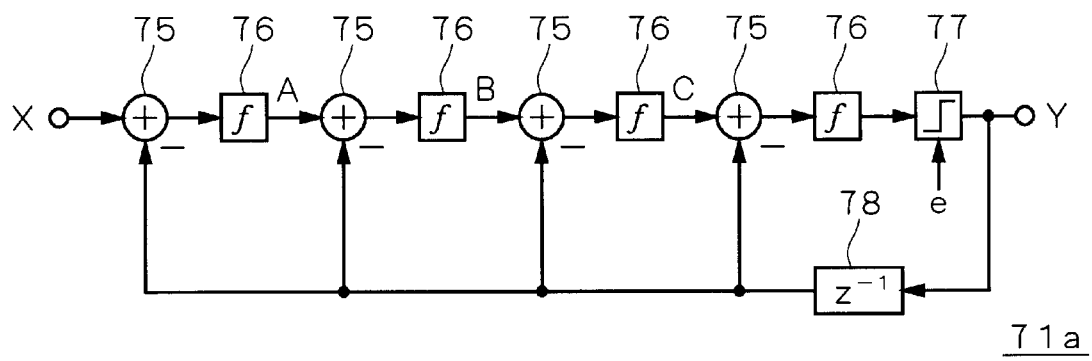
FIG. 15 is a block diagram of a conventional modulator.
Figure 16:
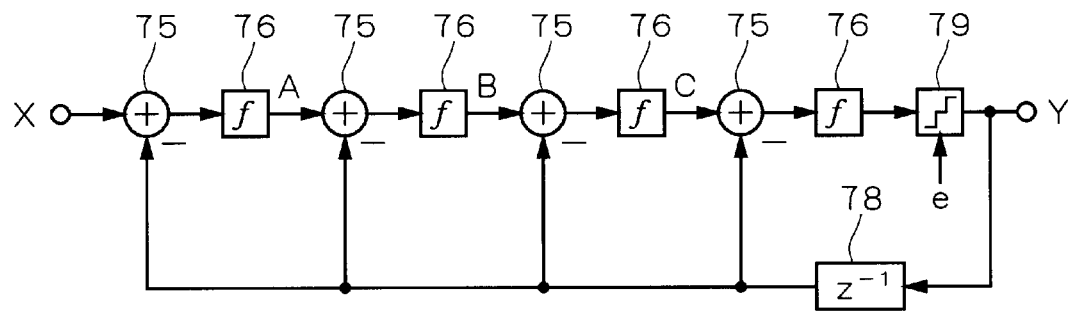
FIG. 16 is a block diagram of another conventional modulator.
Figure 17:
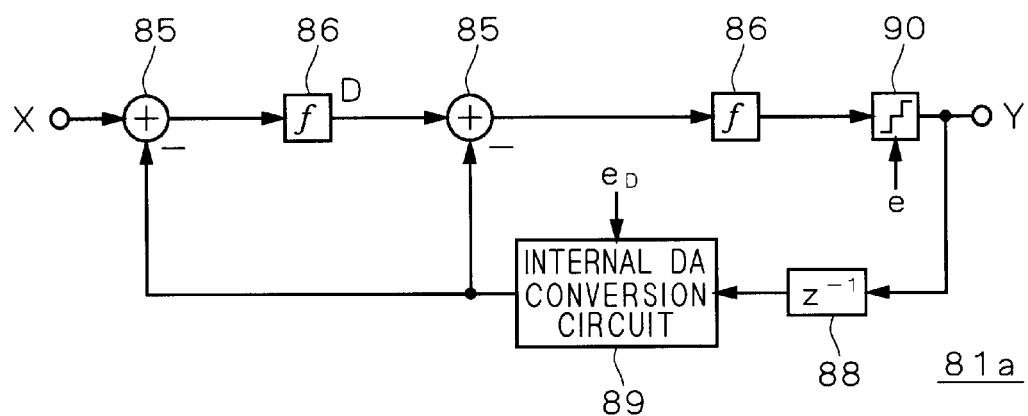
FIG. 17 is a block diagram of a still another conventional modulator.

While the foregoing preferred embodiments show the case where the modulators M1 to Mk and modulators N1 to Nk are all configured as the first-order modulator, they may be generally a modulator of second-order or less. The second-order modulator preferably has a feedback loop with two branches having different orders of integration, as in the conventional modulator shown in FIGS. 15 to 17. The delay circuit 4 and 14 can be disposed at other locations in the feedback loop.

In such general embodiment, the configuration of the arithmetic operation units Hi and Gi expandable as follows. When the arithmetic operation unit Hi (or Gi) feeds back a signal from the i+1 stage modulator Mi+1 (or Ni+1) to the t-th ($1 \leq t \leq i$) stage modulator Mt (or Nt), Formula 9 and Formula 10 are expandable to:

$$Hi \text{ or } Gi = (1-z^{-1})^K/z^{-L} \quad (33)$$

wherein K is an integer and denotes the sum of the orders of integrators along a path from an arithmetic operation unit 1 of the (t+1)th stage modulator to an arithmetic operation unit Hi (or Gi); and L is an integer and denotes the sum of the orders of delay circuits along a path from the arithmetic operation unit 1 of the t-th modulator to the arithmetic operation unit Hi (or Gi). That is, the order of a differentiator and leading circuit contained in the arithmetic operation unit Hi (or Gi) is set such as to cancel the sum of the orders of the integrators and the sum of the orders of the delay circuits, along the respective paths described.

Taking the arithmetic operation unit H2 of the preferred embodiment shown in FIG. 5, as an example, integer L is zero because the sum of the orders of the delay circuits disposed along the path from the arithmetic operation unit 1 of the modulator M1 to the arithmetic operation unit H2 is zero (i.e., no delay circuit is disposed), and integer K is set to two because the sum of the orders of the integrators disposed along the path from the arithmetic operation unit 1 of the modulator M2 to the arithmetic operation unit H2 is two.

While the invention has been shown and described in detail, the foregoing description is in all aspects illustrative and not restrictive. It is therefore understood that numerous modifications and variations can be devised without departing from the scope of the invention.

What is claimed is:

1. A ΔΣ modulator comprising:
    (A) 1-bit first to (k−1)th ($k \geq 2$) modulators of second-order or less, each m-th ($1 \leq m \leq k-1$) modulator comprising, along a first feedback loop, (A-1) an integrator, (A-2) a quantizer for performing quantization by 1-bit, connected to an output of said integrator, and (A-3) a first arithmetic operation unit disposed between an output of said quantizer and an input of said integrator, in which an input signal to said m-th modulator and a reverse signal of a signal from said quantizer are added and, in case that a feedback signal to said m-th modulator is present, said feedback signal is further added to transmit a result to said integrator, said each m-th modulator further comprising (A-4) a delay circuit having a predetermined order which delays signal transmission and is disposed within said first feedback loop, and (A-5) a second arithmetic operation unit which outputs a reverse signal of an error signal of said quantizer, as an input signal of a next stage modulator;
    (B) a multi-bit k-th modulator of second-order or less, comprising, along a second feedback loop, (B-1) an integrator, (B-2) a quantizer for performing quantization by a multi-bit, connected to an output of said integrator (B-1), and (B-3) a first arithmetic operation unit disposed between an output of said quantizer and an input of said integrator, in which an input signal to said k-th modulator and a reverse signal of a signal from said quantizer (B-2) are added to transmit the result to said integrator (B-1), said k-th modulator further comprising (B-4) a delay circuit having a predetermined order which delays signal transmission and is disposed within said second feedback loop; and
    (C) first to (k−1)th feedback arithmetic operation units, each i-th ($1 \leq i \leq k-1$) feedback arithmetic operation unit being connected to an output of said quantizer of said (i+1)th modulator, comprising (C-1) a leading circuit having an order which cancels sum of orders of delay circuits along a path from said first arithmetic operation unit of said t-th ($1 \leq t \leq i$) modulator to said i-th feedback arithmetic operation unit, and (C-2) a differentiator circuit having an order which cancels sum of orders of integrators along a path from said first arithmetic operation unit of said (t+1)th modulator to said i-th feedback arithmetic operation unit, thereby a result of arithmetic operation is transmitted, as said feedback signal, to said first arithmetic operation unit of said t-th modulator.

2. The ΔΣ modulator according to claim 1 wherein said each i-th feedback arithmetic operation unit transmits said result of arithmetic operation, as said feedback signal, to said first arithmetic operation unit of said i-th modulator.

3. The ΔΣ modulator according to claim 1 wherein said each i-th feedback arithmetic operation unit transmits said result of arithmetic operation, as said feedback signal, to the said first arithmetic operation unit of said first modulator.

4. The ΔΣ modulator according to claim 1 wherein,
said each n-th ($1 \leq n \leq k$) modulator further comprises a DA conversion circuit disposed between said quantizer of said n-th modulator and said first arithmetic operation unit of said n-th modulator, for converting a signal from digital form into analog form; and
said each i-th feedback arithmetic operation unit is connected to said output of said quantizer of said (i+1)th modulator, through said DA conversion circuit of said (i+1)th modulator.

5. The ΔΣ modulator according to claim 4 wherein,
said delay circuit of said each m-th modulator is disposed between said integrator of said m-th modulator and said quantizer of said m-th modulator.

6. The ΔΣ modulator according to claim 1 wherein,
said each n-th ($1 \leq n \leq k$) modulator is a first-order modulator.

7. The ΔΣ modulator according to claim 1 wherein,
said delay circuit of said each n-th ($1 \leq n \leq k$) modulator is a first-order delay circuit.

8. A DA converter comprising:
an interpolation filter receiving a digital signal;
a ΔΣ modulator receiving an output signal of said interpolation filter and having (A) 1-bit first to (k−1)th ($k \geq 2$) modulators of second-order or less, each m-th ($1 \leq m \leq k-1$) modulator comprising, along a first feedback loop, (A-1) an integrator, (A-2) a quantizer for performing quantization by 1-bit, connected to an output of said integrator, and (A-3) a first arithmetic operation unit disposed between an output of said quantizer and an input of said integrator, in which an input signal to said m-th modulator and a reverse signal of a signal from said quantizer are added and, in case that a feedback signal to said m-th modulator is present, said feedback signal is further added to transmit a result to said integrator, said each m-th modulator further comprising (A-4) a delay circuit having a predetermined order which delays signal transmission and is disposed within said first feedback loop, and (A-5) a second arithmetic operation unit which outputs a reverse signal of an error signal of said quantizer, as an input signal of a next stage modulator; (B) a multi-bit k-th modulator of second-order or less, comprising, along a second feedback loop, (B-1) an integrator, (B-2) a quantizer for performing quantization by a multi-bit, connected to an output of said integrator (B-1), and (B-3) a first arithmetic operation unit disposed between an output of said quantizer and an input of said integrator, in which an input signal to said k-th modulator and a reverse signal of a signal from said quantizer (B-2) are added to transmit the result to said integrator (B-1), said k-th modulator further comprising (B-4) a delay circuit having a predetermined order which delays signal transmission and is disposed within said second feedback loop; and (C) first to (k−1)th feedback arithmetic operation units, each i-th ($1 \leq i \leq k-1$) feedback arithmetic operation unit being connected to an output of said quantizer of said (i+1)th modulator, comprising (C-1) a leading circuit having an order which cancels sum of orders of delay circuits along a path from said first arithmetic operation unit of said t-th ($1 \leq t \leq i$) modulator to said i-th feedback arithmetic operation unit, and (C-2) a differentiator circuit having an order which cancels sum of orders of integrators along a path from said first arithmetic operation unit of said (t+1)th modulator to said i-th feedback arithmetic operation unit, thereby a result of arithmetic operation is transmitted, as said feedback signal, to said first arithmetic operation unit of said t-th modulator;
a conversion circuit converting an output signal of said ΔΣ modulator into an analog signal; and
a lowpass filter receiving an output signal of said conversion circuit.

9. A DA converter comprising:
a ΔΣ modulator receiving an analog signal and having (A) 1-bit first to (k−1)th ($k \geq 2$) modulators of second-order or less, each m-th ($1 \leq m \leq k-1$) modulator comprising, along a first feedback loop, (A-1) an integrator, (A-2) a quantizer for performing quantization by 1-bit, connected to an output of said integrator, and (A-3) a first arithmetic operation unit disposed between an output of said quantizer and an input of said integrator, in which an input signal to said m-th modulator and a reverse signal of a signal from said quantizer are added and, in case that a feedback signal to said m-th modulator is present, said feedback signal is further added to transmit a result to said integrator, said each m-th modulator further comprising (A-4) a delay circuit having a predetermined order which delays signal transmission and is disposed within said first feedback loop, and (A-5) a second arithmetic operation unit which outputs a reverse signal of an error signal of said quantizer, as an input signal of a next stage modulator; (B) a multi-bit k-th modulator of second-order or less, comprising, along a second feedback loop, (B-1) an integrator, (B-2) a quantizer for performing quantization by a multi-bit, connected to an output of said integrator (B-1), and (B-3) a first arithmetic operation unit disposed between an output of said quantizer and an input of said integrator, in which an input signal to said k-th modulator and a reverse signal of a signal from said quantizer (B-2) are added to transmit the result to said integrator (B-1), said k-th modulator further comprising (B-4) a delay circuit having a predetermined order which delays signal transmission and is disposed within said second feedback loop; and (C) first to (k−1)th feedback arithmetic operation units, each i-th ($1 \leq i \leq k-1$) feedback arithmetic operation unit being connected to an output of said quantizer of said (i+1)th modulator, comprising (C-1) a leading circuit having an order which cancels sum of orders of delay circuits along a path from said first arithmetic operation unit of said t-th ($1 \leq t \leq i$) modulator to said i-th feedback arithmetic operation unit, and (C-2) a differentiator circuit having an order which cancels sum of orders of integrators along a path from said first arithmetic operation unit of said (t+1)th modulator to said i-th feedback arithmetic operation unit, thereby a result of arithmetic operation is transmitted, as said feedback signal, to said first arithmetic operation unit of said t-th modulator, wherein said each n-th ($1 \leq n \leq k$) modulator further comprises a DA conversion circuit disposed between said quantizer of said n-th modulator and said first arithmetic operation unit of said n-th modulator, for converting a signal from digital form into analog form; and said each i-th feedback arithmetic operation unit is connected to said output of said quantizer of said (i+1)th modulator, through said DA conversion circuit of said (i+1)th modulator; and
a decimation filter receiving an output signal of said ΔΣ modulator.

* * * * *